United States Patent [19]

Hayden et al.

[11] Patent Number: 5,104,689
[45] Date of Patent: Apr. 14, 1992

[54] METHOD AND APPARATUS FOR AUTOMATED SOLDER DEPOSITION AT MULTIPLE SITES

[75] Inventors: Terry F. Hayden, Round Rock; Christopher A. Hicks, Austin; Rodney A. Pooler, Round Rock, all of Tex.

[73] Assignee: International Business Machines Corporation, Armonk, N.Y.

[21] Appl. No.: 586,652

[22] Filed: Sep. 24, 1990

[51] Int. Cl.⁵ ............................................. C23C 26/00
[52] U.S. Cl. ..................................... 427/123; 427/96; 118/323; 118/696
[58] Field of Search ................. 427/123, 96; 118/323, 118/696

[56] References Cited

U.S. PATENT DOCUMENTS

| | | | |
|---|---|---|---|
| 3,661,638 | 5/1972 | Lemecha | 427/431 |
| 3,705,457 | 12/1972 | Tardoskegyi | 118/72 |
| 4,087,906 | 5/1978 | Cobaugh | 427/123 |
| 4,169,841 | 10/1986 | Schwerin | 427/96 |
| 4,201,150 | 5/1980 | Edwards | 118/323 |
| 4,206,254 | 6/1980 | Schmeckenbecher | 427/96 |
| 4,360,144 | 11/1982 | Cuddy | 427/96 |
| 4,389,771 | 6/1983 | Cassidy | 427/96 |
| 4,493,856 | 1/1985 | Kumar | 427/96 |
| 4,546,724 | 10/1985 | Kiryn | 118/323 |
| 4,555,414 | 11/1985 | Hoover | 427/43.1 |
| 4,608,941 | 9/1986 | Morris | 427/96 |
| 4,766,844 | 8/1988 | Brewer | 427/123 |
| 4,821,673 | 4/1989 | Kirigakubo | 118/323 |
| 4,898,117 | 2/1990 | Ledermann | 118/679 |
| 4,922,852 | 5/1990 | Price | 118/323 |
| 4,987,854 | 1/1991 | Hall | 118/323 |
| 5,042,708 | 8/1991 | Ledermann | 228/257 |

*Primary Examiner*—Shrive Beck
*Assistant Examiner*—Vi Duong Dang
*Attorney, Agent, or Firm*—Andrew J. Dillon

[57] ABSTRACT

The method and apparatus of the present invention permits the automated deposition of heated solder onto a plurality of conductive pads which are disposed in one or more linear arrays on a circuit board or other planar member. A robotically controlled arm is utilized to mount a solder nozzle and selectively manipulate the solder nozzle over the circuit board. The solder nozzle is first manipulated to a selected point offset in a known direction and distance from a first conductive pad by means of a data set which specifies the centroid and footprint for a selected group of conductive pads. After feeding solder into the solder nozzle, aligning the solder nozzle at a desired angle parallel to a linear array of conductive pads and lowering the solder nozzle until a solder droplet contacts the circuit board, the solder nozzle is manipulated at a substantially constant velocity toward the first conductive pad and thereafter along a selected line which tracks the linear array of conductive pads. To avoid solder starvation at the last few pads in a linear array, the solder nozzle is manipulated at a selected angle away from the selected line while decreasing the solder nozzle velocity. The angle of departure from the selected line is preferably an acute angle selected so that the solder nozzle avoids contact with alignment points or other areas which do not require solder deposition.

7 Claims, 1 Drawing Sheet

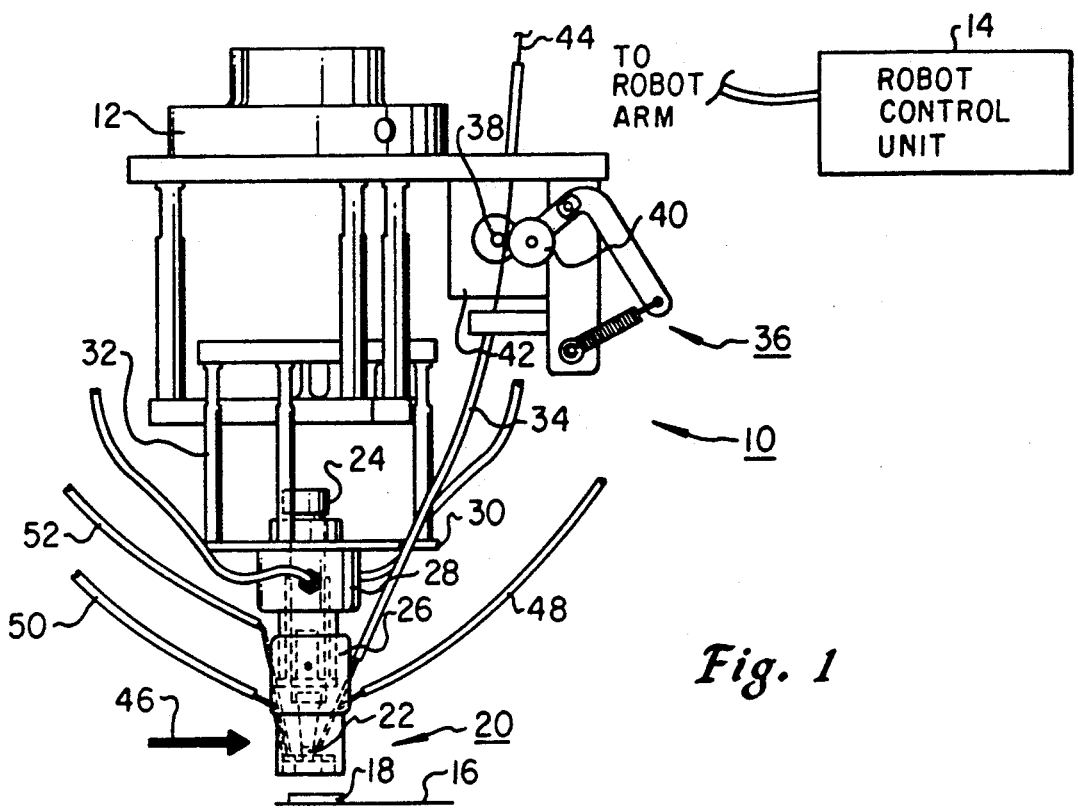
*Fig. 1*
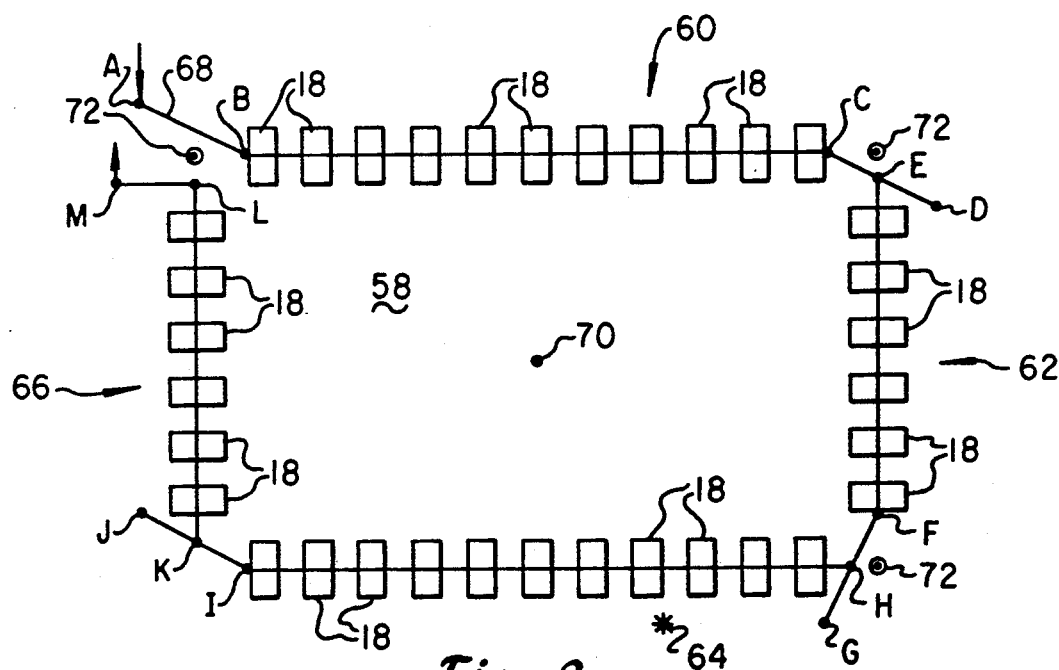
*Fig. 2*
| POINT | A | B | C | D | E | F | G | H | I | J | K | L | M |
|---|---|---|---|---|---|---|---|---|---|---|---|---|---|
| NOZZLE ORIENTATION | → | → | → | ↓ | ↓ | ↓ | ← | ← | ← | ↑ | ↑ | ↑ | |
*Fig. 3*

METHOD AND APPARATUS FOR AUTOMATED SOLDER DEPOSITION AT MULTIPLE SITES

BACKGROUND OF THE INVENTION

1. Technical Field

The present invention relates in general to systems for soldering and in particular to a method and apparatus for depositing solder at multiple sites on a circuit board. Still more particularly, the present invention relates to a method and apparatus for automated solder deposition at multiple sites wherein a uniform amount and thickness of solder may be deposited at each of a plurality of conductive pads.

2. Description of the Related Art

Solder distribution onto mounting pads for surface mount boards has generally been accomplished in the semiconductor industry utilizing a screening process. In a screen process artwork and screens must be fabricated having the solder deposition pattern. Then, a precise alignment process is carried out wherein the solder is screened onto the surface mount pads. The solder paste used for this process requires a substantially long cure and bake time. Thus, in addition to the necessary complexity of the alignment process, this prior art technique is relatively time consuming.

The prior art solder distribution technique utilizing screening is further complicated by a requirement that the pattern mix very fine lead pitch and with surface mount pads along with standard surface mount pads. For example, in the case of tape automated bonding, the pitches vary from four to twenty mils, while standard surface mount parts have pitches in the range of twenty to fifty mils. Thus, this process requires the different amounts of solder be distributed on various parts of the board. Given the precision required, it is common to utilize separate screening steps, one for very fine lead pitch and with surface mount parts and a second for standard surface mount parts. There is also a possibility of damaging the solder deposited in a previous step when multiple screening operations are carried out. Additionally, screening fine line solder presents a problem because the solder paste tends to stick in the openings of the screen, as the openings get progressively narrower.

The prior art also discloses other techniques for depositing solder across the surface of a printed circuit. Dip soldering and wave soldering are both techniques which are known in the prior art. Wave soldering involves pumping a molten solder through a nozzle to form a standing wave. In this process, the entire side of an assembly containing printed conductors with the leads from the circuit components projecting through various points generally travels at a predetermined rate of speed over the standing surface of the wave of molten solder. The lower surface of the assembly is placed into contact with the upper fluid surface of the wave.

By this technique, the solder wave in the first instance wets the joining surfaces and promotes through hole penetration. This in turn helps to assure the formation of reliable solder joints and fillets. Wave soldering is illustrated in U.S. Pat. Nos. 3,705,457 and 4,360,144. An example of an immersion technique is illustrated in U.S. Pat. No. 4,608,941 wherein panels are immersed in a liquid solder bath and then conveyed to an air knife which levels the molten solder on the panels. The air knife is therefore used to effectively clear the panels of excess solder and only the printed patterns retain the solder.

Another example of a solder leveler is contained in U.S. Pat. No. 4,619,841. The technique disclosed therein is used in conjunction with dip soldering techniques. Other techniques of selective deposition of solder onto printed circuit patterns are described in U.S. Pat. Nos. 4,206,254, 4,389,771 and 4,493,856.

U.S. Pat. No. 3,661,638 is also directed to a system for leveling and controlling the thickness of a conductive material on the walls of through-holes of a printed circuit board. That technique for removing the excess amount of conductive material employs heating to melt a conductive material after it has been deposited. Then, while the conductive material is in a plastic state, gyrating the board to cause the plastic material to move circumferentially about the through-hole and flow axially through the through-hole. More recently, several techniques have been proposed which utilizes a solder nozzle which deposits solder onto solder wettable contact pads in substantially uniform amounts on each pad. The tool utilized with such a nozzle generally comprises a solder reservoir or plenum, a heating element to melt the solder, and at the bottom of the reservoir, a foot which contains the nozzle and which passes over the contact pads to be wetted with solder. Examples of these types of systems are disclosed in U.S. Pat. No. 4,898,117, filed Apr. 15, 1988, entitled "Solder Deposition System" and U.S. patent application Ser. No. 07/586,655, now U.S. Pat. No. 5,042,708, filed of even date herewith entitled "Solder Placement Nozzle Assembly."

One problem which exists with the solder nozzle techniques described above is attributable to the manner in which these solder nozzles are controlled and manipulated by means of a robotic arm. Contact pads for the mounting of integrated circuit devices are typically disposed on a circuit board in linear arrays, typically in parallel rows or in a square or rectangle. During manipulation of solder nozzle utilizing a robotic arm over such a plurality of conductive pads a problem occurs at the end of each row or linear array of conductive pads. The absence of additional conductive pads beyond the last pad in a linear array often causes the solder which has been deposited onto the last few conductive pads in a linear array to be "dragged" off the last few conductive pads by the solder nozzle, leading to a condition known as "solder starvation." This condition is generally thought to be brought about by the lack of additional conductive pads beyond the last few in an array and/or by the abrupt change of direction of the solder nozzle which must necessarily occur to permit the next linear array of conductive pads to be coated with a desired thickness of solder.

Thus, it should be apparent that a need exists for a method and apparatus wherein solder may be deposited in a uniform manner and thickness on a plurality of conductive pads which are disposed in one or more linear arrays on the surface of a circuit board.

SUMMARY OF THE INVENTION

It is therefore one object of the present invention to provide an improved system for soldering.

It is another object of the present invention to provide an improved system for soldering which permits solder to be deposited in a precise manner on a plurality of conductive pads.

It is yet another object of the present invention to provide an improved method and apparatus whereby solder may be uniformly deposited in a desired thickness on a plurality of conductive pads which are disposed in multiple orthogonal arrays.

The foregoing objects are achieved as is now described. The method and apparatus of the present invention permits the automated deposition of heated solder onto a plurality of conductive pads which are disposed in one or more linear arrays on a circuit board or other planar member. A robotically controlled arm is utilized to mount a solder nozzle and selectively manipulate the solder nozzle over the circuit board. The solder nozzle is first manipulated to a selected point offset in a known direction and distance from a first conductive pad by means of a data set which specifies the centroid and footprint for a selected group of conductive pads. After feeding solder into the solder nozzle, aligning the solder nozzle at a desired angle parallel to a linear array of conductive pads and lowering the solder nozzle until a solder droplet contacts the circuit board, the solder nozzle is manipulated at a substantially constant velocity toward the first conductive pad and thereafter along a selected line which tracks the linear array of conductive pads. To avoid solder starvation at the last few pads in a linear array, the solder nozzle is manipulated at a selected angle away from the selected line while decreasing the solder nozzle velocity. The angle of departure from the selected line is preferably an acute angle selected so that the solder nozzle avoids contact with alignment points or other areas which do not require solder deposition. After stopping the solder nozzle at a second point offset from the array of conductive pads, the solder nozzle is once again aligned parallel to the next linear array of conductive pads and the process is repeated.

BRIEF DESCRIPTION OF THE DRAWING

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 1 is a partially schematic side view of a solder deposition system which may be utilized in accordance with the present invention;

FIG. 2 is a top view of a plurality of conductive pads disposed on the surface of a circuit board and the solder nozzle path which may be utilized in accordance with the present invention; and FIG. 3 is a chart depicting the various points of the solder nozzle path of FIG. 2 and a preferred solder nozzle orientation between each pair of adjacent points.

DETAILED DESCRIPTION OF PREFERRED EMBODIMENT

With reference now to the figures and in particular with reference to FIG. 1, there is depicted a partially schematic side view of a solder deposition system 10 which may be utilized in accordance with the present invention. As is illustrated, solder deposition system 10 may be utilized to deposit solder onto a selected site which is preferably a conductive pad. Solder deposition system 10 preferably includes a manipulatable robotic arm 12, which may be accurately, efficiently and rapidly moved from point to point by means of robot control unit 14, in a manner well known in the art. Solder deposition system 10 is preferably utilized to accurately position solder nozzle assembly 20 at a selected height above planar surface 16. Disposed on the upper surface of planar surface 16 is conductive pad 18. Of course, conductive pad 18 represents only one of a plurality of conductive pads which are typically located on a circuit board in a modern electronic assembly.

Solder deposition system 10 also includes a nozzle mount 28 which is supportable over conductive pad 18 of planar surface 16. Nozzle mount 28 has a length and an internal bore which is sized to receive an elongate heat source. Preferably nozzle mount 28 has a polygonally shaped upper exterior which is approximately square and a generally cylindrically shaped lower exterior which, together, define the overall length. Preferably, an elongate heat source such as heated tip 22 of soldering iron 24 is disposed within the internal bore of nozzle mount 28. Soldering iron 24 is preferably a commercially available soldering iron and may be, for instance, a nickle, iron or palladium coated copper soldering iron connected to a conventional electrical heating source (not shown).

Solder nozzle assembly 20 preferably also includes a nozzle head 26 which has an upper, generally cylindrical interior bore which joins a lower, converging interior bore provided with a solder feed orifice, which is connected by a slanting internal passageway (not shown) which passes through the body of nozzle head 26 to a source of solid solder being fed to the passageway. As is illustrated in FIG. 1, the internal passageway may be connected by a solder tube 34 to a solder wire feed assembly 36. Solder wire feed assembly 36 may include, for example, a motor driven gear wheel 38 and a pressure wheel 40 which are used to deliver a known length of wire solder 44 to nozzle head 26. Advancement of wire solder 44 may be precisely controlled through the utilization of a stepper motor 42, as will be appreciated by those skilled in the art. Solder fed through the orifice into nozzle head 26 will melt on the heated metal tip 22 of soldering iron 24 and flow to the bottom of a reservoir formed within nozzle head 26.

Mounting means are preferably provided for removably mounting nozzle head 26 to nozzle mount 28. This, as those skilled in the art will appreciate, may conveniently comprise a plurality of threaded members, such as set screws.

Nozzle mount 28 is then preferably supported in any convenient fashion over conductive pad 18 of planar surface 16. In the embodiment disclosed in FIG. 1, nozzle mount 28 is secured to a circular mounting plate 30 by means of yoke assembly 32. Yoke assembly 32 serves to mount mounting plate 30 to robotic arm 12, in any manner well known in the art.

Preferably, nozzle mount 28 and nozzle head 26 are formed from a non-wettable, plastic material. A preferred material is the polyimide sold under the trade name VESPEL by E.I. DuPont DeNemours & Company. This material is lightweight, easily machineable and, to some extent chemically resistant. However, the material is degraded rapidly at high temperatures for long periods of time. At operating temperatures above 5-600 degrees Fahrenheit, dimensions, thermal conductivity and other critical properties of the VESPEL material may change.

As disclosed in one of the above-referenced patent applications an insulating sleeve may be mounted within the internal bore of nozzle mount 28 to separate heated metal tip 22 of soldering iron 24 from nozzle mount 28, in order to decrease the likelihood that nozzle mount 28 and nozzle head 26 may be degraded by the heat source therein.

As illustrated in FIG. 1, solder nozzle assembly 20 is preferably manipulated above conductive pad 18 and planar surface 16 in a line of movement indicated at arrow 46. Those skilled in this art will appreciate that solder nozzle assembly 20 may be constructed having a leading edge and a trailing edge. This may be desirable due to several factors. For example, a gas line 48 may be utilized to provide a source of an inert gas, such as nitrogen, to bathe conductive pad 18 prior to the deposition of solder thereon to minimize oxidation.

Supply tubes 50 and 52 may also be utilized to provide a combination of inert gases and/or fluxes to increase the bonding efficiency of solder deposition system 10. Those skilled in the art will appreciate that in situations in which it is desired to bathe conductive pad 18 with an inert gas prior to the deposition of solder, solder nozzle assembly 20 must be manipulated in a direction consistent with the leading edge and trailing edge characterization of solder nozzle assembly 20. Of course, in applications in which no such treatment of conductive pads 18 is desired the orientation of solder nozzle assembly 20 is of less importance.

Referring now to FIG. 2, there is depicted a top view of a plurality of conductive pads 18 which are disposed on a circuit board in a particular footprint 58. Solder nozzle path 68 is also indicated in FIG. 2. Solder nozzle path 68 is preferably the line of travel of solder nozzle assembly 20 which may be programmed into robotic control unit 14 (see FIG. 1) so that solder nozzle assembly 20 may rapidly and efficiently follow the designated path. Those skilled in the art will appreciate, upon reference to the foregoing, that solder nozzle path 68 may be defined utilizing a computerized system by identifying centroid 70 of footprint 58, along with the characteristics of footprint 58. That is, whether footprint 58 comprises one line of conductive pads, two parallel lines of conductive pads, or as illustrated, a rectangular array comprising four separate linear arrays. As is illustrated, the beginning point for deposition of solder in an array such as that illustrated by footprint 58 may be simply and easily located by utilization of the coordinates of centroid 70 and the size and orientation of footprint 58.

In the example depicted in FIG. 2, footprint 58 comprises a rectangular array of conductive pads 18 which are disposed in four separate linear arrays. First linear array 60, second linear array 62, third linear array 64 and fourth linear array 66. Multiple points along solder nozzle path 68 are designated by alphabetic letters which indicate the sequence in which the illustrated path is followed. That is, solder nozzle path 68 proceeds from point A to point B, thereafter to point C and to the remaining points in like manner. In accordance with an important feature of the present invention, point A is offset a selected distance from the line of first linear array 60. This is accomplished so as to avoid passing over alignment point 72 with solder nozzle assembly 20. Such alignment points or "fudicials" are often utilized in robotic systems to permit the system to optically align an electronic component at a desired position so that its conductive leads will correspond to conductive pads 18.

In accordance with the method and apparatus of the present invention solder nozzle assembly 20 is positioned at point A and a desired amount of wire solder 44 is fed into the cavity within solder nozzle assembly 20. Next, solder nozzle assembly 20 is lowered to an appropriate height above planar surface 16 to permit the droplet of solder which extends below the nozzle assembly 20, to contact planar surface 16. Solder nozzle assembly 20 is then manipulated, at a substantially constant velocity, to point B and thereafter to point C along a selected line which tracks first linear array 60.

In accordance with an important feature of the present invention, solder nozzle assembly 20 is urged away from the line which tracks along first linear array 60 at an angle, once solder nozzle assembly 20 reaches point C, which is proximate to the last pad in first linear array 60. Thereafter, as solder nozzle assembly 20 passes from point C to point D, the velocity thereof is decreased. The Applicants have discovered that by turning solder nozzle assembly 20 at an angle away from the line which tracks first linear array 60 and decelerating the movement of solder nozzle assembly 20, the likelihood of solder starvation in the last few conductive pads 18 of first linear array 60 is effectively eliminated.

Thereafter, solder nozzle assembly 20 is rotatably aligned to a preferred alignment for depositing solder along second linear array 62 and solder nozzle assembly 20 is then manipulated, at a substantially constant velocity, from point D to point E and thereafter along a line to point F which tracks along second linear array 62. As above, at point F, a point proximate to the last conductive pad 18 within second linear array 62, solder nozzle assembly 20 is turned at an angle from this line at point E and proceeds thereafter to point F, while decelerating in the manner described above. The remaining sides of foot print 58 are processed in this exact manner until solder nozzle assembly 20 reaches point M where it is lifted away from the circuit board.

With reference now to FIG. 3, there is depicted a chart which illustrates the various points of solder nozzle path 68 and a preferred solder nozzle orientation between each pair of adjacent points. As illustrated, the leading edge and trailing edge of solder nozzle assembly 20 may be aligned to permit the most effective deposition of solder onto conductive pads 18 along each of the linear arrays depicted. Thus, as solder nozzle assembly 20 travels from point A to point B the arrow within the chart of FIG. 3 indicates that solder nozzle assembly 20 is aligned so that the leading edge is oriented in the direction depicted. Thereafter, in accordance with an important feature of the present invention, this alignment is maintained until such time a solder nozzle assembly 20 reaches point D. At that time, prior to manipulating solder nozzle assembly 20 back to a line which will track along second linear array 62, the orientation of solder nozzle assembly 20 is rotated ninety degrees as indicated by the arrow in the chart of FIG. 3, such that solder may be efficiently deposited along second linear array 62. Thereafter, in a similar manner, this orientation of solder nozzle assembly 20 is maintained until solder nozzle assembly 20 reaches point G of solder nozzle path 68.

Upon reaching point G, the orientation of solder nozzle assembly 20 is once again rotated ninety degrees to position solder nozzle assembly 20 in the most efficient manner for depositing solder upon conductive pads 18 along third linear array 64 as indicated by the arrow in the chart of FIG. 3. This procedure continues until such time as solder nozzle assembly 20 reaches point M. Thereafter, solder nozzle assembly 20 is lifted from the surface of planar surface 16 and each conductive pad 18 of footprint 58 will have received a uniform deposit of solder. Those skilled in the art will appreciate that after solder nozzle assembly 20 is raised from planar surface 16 at point M it may be manipulated to a new offset point for application of solder to a second plurality of conductive pads within a second footprint. The second, and each subsequent footprint, solder application is begun by positioning the solder nozzle assembly 20 at point A on the new footprint. The solder nozzle 20 at this point contains solder from the previous solder application, so only a reduced amount of solder needs to be fed into the nozzle before beginning a subsequent footprint.

The second, and each subsequent footprint, solder application is begun by positioning the solder nozzle assembly 20 at point A on the new footprint. The solder nozzle 20 at this point contains solder from the previous solder application, so only a reduced amount of solder needs to be fed into the nozzle. From this point the application proceeds as usual.

The method and apparatus of the present invention provide for the efficient and accurate deposition of solder onto a plurality of conductive pads on a planar surface by urging a solder nozzle assembly away from its line of travel along a linear array of conductive pads at an angle while decreasing the velocity of the solder nozzle to prevent the removal of solder from the last few conductive pads in a linear array. Thereafter, prior to returning the solder nozzle assembly to a second linear array of conductive pads, the solder nozzle assembly is rotated to a proper orientation and then moved to a first conductive pad of a second linear array at a substantially constant velocity. This technique ensures that a proper application of solder to the first few conductive pads in a linear array is accomplished. The angle at which a solder nozzle assembly departs from the line along each linear array may be programmed in a manner which will effectively avoid depositing solder on alignment points, fudicials, or other structures upon which no solder is desired. However, experimentation has shown that uniform solder deposition will occur if the selected angle is between 0° and 75° from the line of travel. In this manner, a plurality of conductive pads on a circuit board or other planar surface may be efficiently and accurately dressed with a uniform thickness of a solder material.

While the invention has been particularly shown and described with reference to a preferred embodiment, it will be understood by those skilled in the art that various changes in form and detail may be made therein without departing from the spirit and scope of the invention.

We claim:

1. A method for depositing solder onto a plurality of conductive pads disposed in a linear array on a planar surface utilizing a robotically controlled solder nozzle which is selectively manipulatable about said planar surface, said method comprising the steps of:

positioning said solder nozzle adjacent to said planar surface at a first selected point offset from a first of said plurality of conductive pads;

manipulating said solder nozzle at a selected substantially constant velocity to said first of said plurality of conductive pads and thereafter along said linear array; and turning said solder nozzle at an angle away from said linear array at a second selected point proximate to a last of said plurality of conductive pads while decreasing the velocity of said solder nozzle wherein a uniform thickness of solder is deposited on each of said plurality of conductive arrays.

2. The method for depositing solder onto a plurality of conductive pads according to claim 1, wherein said first selected point is disposed at a selected distance away from and perpendicular to the line of said linear array.

3. The method for depositing solder onto a plurality of conductive pads according to claim 1, wherein a plurality of alignment points are located on said planar surface and wherein said angle is selected such that said solder nozzle avoids each of said plurality of alignment points.

4. The method for depositing solder onto a plurality of conductive pads according to claim 1, wherein, said angle away from said linear array is an acute angle.

5. The method for depositing solder onto a plurality of conductive pads according to claim 4, wherein said acute angle is between 0 and 75 degrees.

6. An apparatus for depositing solder onto a plurality of conductive pads disposed in a linear array on a planar surface, said apparatus comprising:

a robotically controlled solder nozzle;

means for positioning said robotically controlled solder nozzle adjacent to said planar surface at a first selected point offset from a first of said plurality of conductive pads;

means for manipulating said solder nozzle at a selected substantially constant velocity to said first of said plurality of conductive pads and thereafter along said linear array; and means for altering the path of said solder nozzle at an angle away from said linear array at a second selected point proximate to a last of said plurality of conductive pads while deceasing the velocity of said solder nozzle wherein a uniform thickness of solder is deposited on each of said plurality of conductive pads.

7. The apparatus for depositing solder onto a plurality of conductive pads according to claim 6, wherein said solder nozzle includes a leading edge and a trailing edge and wherein said means for positioning said robotically controlled solder nozzle adjacent to said planar surface at a first selected point offset from a first of said plurality of conductive pads includes means for aligning said leading edge and said trailing edge of said solder nozzle on a line parallel to the line of said linear array prior to manipulating said solder nozzle to said first of said plurality of conductive pads.

* * * * *